US 8,296,697 B2

(12) United States Patent
Gal et al.

(10) Patent No.: US 8,296,697 B2
(45) Date of Patent: Oct. 23, 2012

(54) METHOD AND APPARATUS FOR PERFORMING STATIC ANALYSIS OPTIMIZATION IN A DESIGN VERIFICATION SYSTEM

(75) Inventors: Amit Gal, London (GB); Shlomi Uziel, Mevaseret (IL); Amos Noy, Jerusalem (IL)

(73) Assignee: Cadence Design Systems, Inc., San Jose, CA (US)

( * ) Notice: Subject to any disclaimer, the term of this patent is extended or adjusted under 35 U.S.C. 154(b) by 596 days.

(21) Appl. No.: 11/725,288

(22) Filed: Mar. 19, 2007

(65) Prior Publication Data
US 2008/0235640 A1 Sep. 25, 2008

(51) Int. Cl.
*G06F 17/50* (2006.01)
(52) U.S. Cl. ........................................... 716/106
(58) Field of Classification Search ................ 716/1–18, 716/100–139
See application file for complete search history.

(56) References Cited

U.S. PATENT DOCUMENTS

| 6,182,258 | B1 | 1/2001 | Hollander | |
|---|---|---|---|---|
| 6,684,359 | B2 | 1/2004 | Noy | |
| 2001/0010091 | A1* | 7/2001 | Noy | 716/4 |
| 2002/0040457 | A1* | 4/2002 | Noy | 714/724 |
| 2002/0166089 | A1* | 11/2002 | Noy | 714/741 |

* cited by examiner

*Primary Examiner* — Vuthe Siek
*Assistant Examiner* — Aric Lin
(74) *Attorney, Agent, or Firm* — Holland & Knight LLP; Brian J. Colandreo, Esq.; Mark H. Whittenberger, Esq.

(57) ABSTRACT

Method and apparatus for performing static analysis optimization in a design verification system is described. In one example, a description of a verification environment having constrained objects is obtained. The constrained objects are analyzed incrementally to create a data structure of nodes. Each node includes a description of variables transitively connected by constraints. At least one of the nodes reuses a description from at least one other node. The data structure is then used during logic design verification.

17 Claims, 6 Drawing Sheets

METHOD AND APPARATUS FOR PERFORMING STATIC ANALYSIS OPTIMIZATION IN A DESIGN VERIFICATION SYSTEM

BACKGROUND OF THE INVENTION

1. Field of the Invention

Embodiments of the invention generally relate to solving constraint satisfaction problems and, more specifically, to a method and apparatus for performing static analysis optimization in a design verification system.

2. Description of the Related Art

Constraint resolution is the process of solving constraint satisfaction problems and is an important technology underlying constrained random pattern generation for functional verification of a circuit design. Functional design verification is the process of determining whether an integrated circuit, board, or system-level architecture, exactly implements the requirements defined by the specification of the architecture for that device. Functional design verification for a device under testing (DUT) may be performed on the actual device, or on a simulation model of the device. For the purposes of explanation only and without intending to be limiting in any way, the following discussion centers upon testing which is performed on simulation models of the device.

The process of verifying a design through a simulation model of the device is aided by the availability of hardware description languages such as Verilog and VHDL. These languages are designed to describe hardware at higher levels of abstraction than gates or transistors. The resultant simulated model of the device can receive input stimuli in the form of test vectors, which are a string of binary digits applied to the input of a circuit. The simulated model then produces results, which are checked against the expected results for the particular design of the device. However, these languages are typically not designed for actual verification. Therefore, the verification engineer must write additional programming code in order to interface with the models described by these hardware description languages in order to perform design verification of the device.

Examples of testing environments include directed testing and constrained random testing environments. A directed testing environment drives pre-computed test vectors into the simulation model of the DUT and/or examines the results after operation of the simulation model. A more useful and efficient type of testing is a constrained random testing environment. For this type of environment, a set of constraints is written to generate the test vectors in concurrence with the simulation of the model of the DUT and while potentially being controlled by the state feedback of the simulated device. This procedure enables constrained random generation to be performed and to be sensitive to effects uncovered during the test itself on the state of the simulation model of the device. Thus, dynamic test generation clearly has many advantages for design verification.

Within the area of testing environments, both static and dynamic testing environments can be implemented only with fixed-vector or pre-generation input. However, a more powerful and more sophisticated implementation uses test generation to produce the environment. Test generation involves the directed, random or pseudorandom generation of test vectors. One type of test generation process uses a configurable, constraint-based test generator to produce the test vectors. One example of a constraint-based test generator is disclosed in U.S. Pat. No. 6,182,258, issued Jan. 30, 2001, which is incorporated by reference herein. Unlike a typical constraint satisfaction problem, functional verification requires that a constraint system be solved repeatedly, possibly millions of times during a given verification run. Hence, the speed in which constraint systems are solved is of critical importance in functional verification.

Static analysis of constraints is one technique that can be used to improve performance. Static analysis is a processing phase that takes place before the first time that the verification process is executed. During the static analysis phase, sets of constraints are reduced as much as possible, leaving only decisions that cannot be computed upfront for determination during runtime. The results of the static analysis are stored for the runtime phase in some convenient format. The runtime phase reads in the results of the static analysis as it encounters constraint sets, which results in simplified problems and much greater processing speed. An exemplary static analysis process is disclosed in U.S. Pat. No. 6,684,359, issued Jan. 27, 2004, which is incorporated by reference herein.

Presently, static analysis processes perform analysis on the complete set of constraints, regardless of whether such analysis has been previously performed on any portion of the constraints. That is, present static analysis processes are non-incremental. Notably, it is often the case that a verification environment is targeted to a particular goal by introducing additional constraints to an established set of constraints for which static analysis has already been performed. The additional constraints are typically few in number compared to the number of constraints in the established constraint set. A non-incremental static analysis process analyzes the entire augmented constraint set, even though only a few constraints have been added to the problem. Thus, the cost of performing the static analysis is proportional to the complete set of constraints, rather than the additional constraints. Accordingly, there exists a need in the art for performing static analysis optimization in a design verification system.

SUMMARY OF THE INVENTION

An aspect of the invention relates to optimizing constraint resolution in a logic design verification system. In one embodiment, a description of a verification environment having constrained objects is obtained. The constrained objects are analyzed incrementally to create a data structure of nodes. Each node includes a description of variables transitively connected by constraints. At least one of the nodes reuses a description from at least one other node. The data structure is then used during logic design verification.

Another aspect of the invention relates to a test generation system. A simulator is configured to simulate a design for a device under test. A static analyzer is configured to obtain a description of a verification environment having constrained objects and incrementally create a data structure by analyzing each of the constrained objects. A test generator is configured to process the data structure to generate at least one random solution to a constraint satisfaction problem provided by the verification environment. A run-time system is configured to drive and sample the simulator based on the at least one random solution.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only

DETAILED DESCRIPTION

Figure 1:
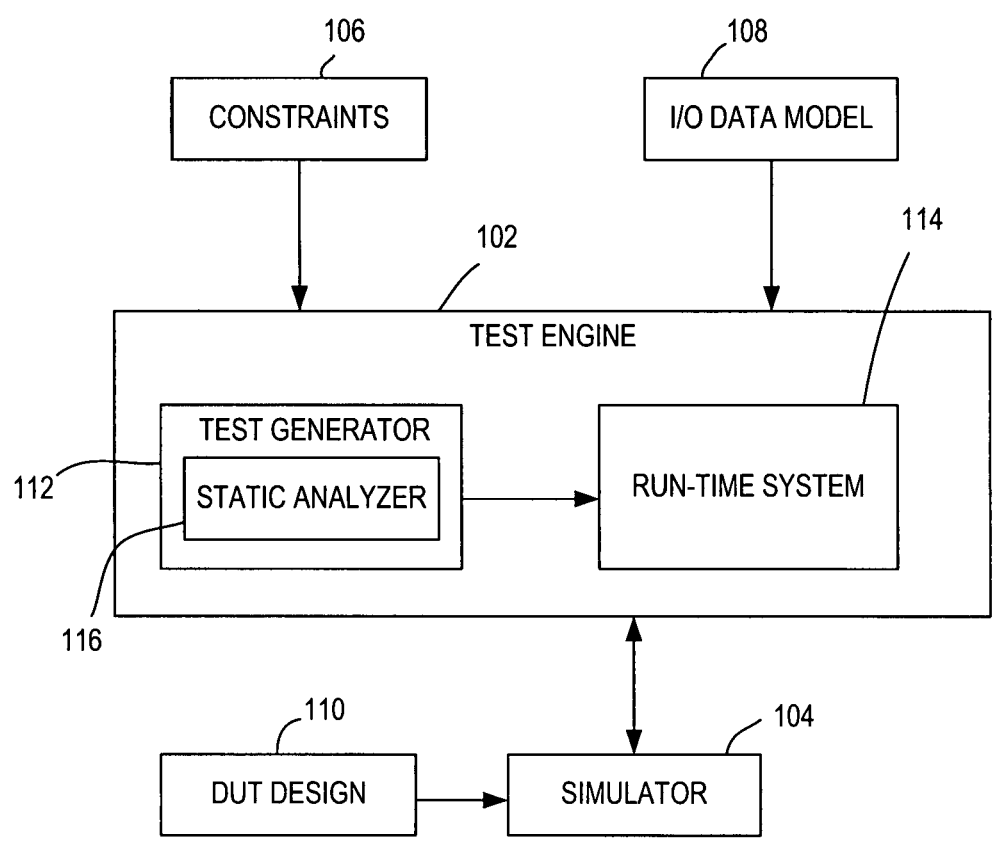
FIG. 1 is a block diagram depicting an exemplary embodiment of a test generation system in accordance with one or more aspects of the invention.

FIG. 1 is a block diagram depicting an exemplary embodiment of a test generation system 100 in accordance with one or more aspects of the invention. It should be noted that the illustrated system only includes those general functions of the test generation procedure which are required for the description of the invention. A more complete description of the entire test generation procedure may be found in U.S. Pat. No. 6,182,258, previously incorporated by reference. It should be noted that although the invention is described in the context of a simulation model, the invention is also useful for verification of a physical device. Both the physical device and the simulation model can be described as a device under test (DUT), which is in a test environment. In addition, one or more aspects of the invention are described with respect to the domain of hardware verification. Those skilled in the art will appreciate that embodiments of the invention may be used in the context of other domains, such as embedded software verification and the like.

The test generation system 100 includes a test engine 102 and a simulator 104. The simulator 104 is configured to receive a design 110 for a DUT. In one embodiment, the design 110 is written in a hardware description language, such as Verilog, System Verilog, or VHDL. The design 110 may also be written using any software language used to represent software models, such as SystemC and the like. The simulator 104 is configured for communication with the test engine 102 for performing a test generation procedure at run-time. The interaction between the simulator 104 and the test engine 102 is shown as bidirectional, since the test engine 102 provides input to the simulator 104 and in turn receives results from the simulator 104 as input for further operation.

The test engine 102 includes a test generator 112 and a run-time system 114. The test engine 102 is configured to receive a set of constraints 106 and an input/output (I/O) data model 108 for the DUT design 110. The test generator 112 uses the constraints 106 and the I/O data model 108 to perform testing and verification of the DUT design 110. The constraints 106 may include static constraints that do not depend on any particular state of the DUT design 110 or verification environment, as well as dynamic constraints that do depend on such state. In either case, the constraints 106 are eventually solved at run-time, as described below. The run-time system 114 both drives and samples the simulator 104 during the run-time testing procedure.

The test generator 112 includes a static analyzer 116. The static analyzer 116 performs an initial analysis of the dynamic constraints before run-time in cooperation with the test generator 112. This initial analysis produces a data structure that describes a reduced version of the constraint system. An exemplary embodiment of a process for producing the data structure is described below with respect to FIG. 2. An exemplary embodiment of a process for updating the data structure in response to an extension to the dynamic constraints is described below with respect to FIG. 4. The dynamic constraints may be extended before run-time or dynamically during run-time. The test generator 112 processes the data structure in conjunction with the run-time system 114 to generate a correct, random solution to the given set of dynamic constraints.

In one embodiment, the constraints 106 and the I/O data model 108 are constructed in e code, which is the code language provided by the SPECMAN functional programming environment, as disclosed in U.S. Pat. No. 6,182,258. The e code language is a hardware-oriented verification specific object-oriented programming language. Objects in this language are instances of "structs", which contain a field, and one or more functions, or methods, which operate on data stored within the field and that interact with other objects. Optionally, a constraint can operate on the field, thereby altering the data stored in the field, for example by restricting the range of possible values for the data. The field can also be used to store more complex structures, including other structs and lists of scalars or structs. While e code is described as an example, it is to be understood that other languages may be used to implement the constraints 106 and the I/O data model 108. For example, the constraints 106 and the I/O data model 108 may be constructed using System Verilog.

The process of test generation fills data elements, including structs and fields, with random values. The possible data values for each element can optionally be limited by constraints, which provide the direction for the directed test generation. For dynamic constraints, as described in greater detail below, a selected, specific solution is provided according to the present invention for each instance of test generation. This solution is then used to provide limitations on the generated data values.

Figure 2:
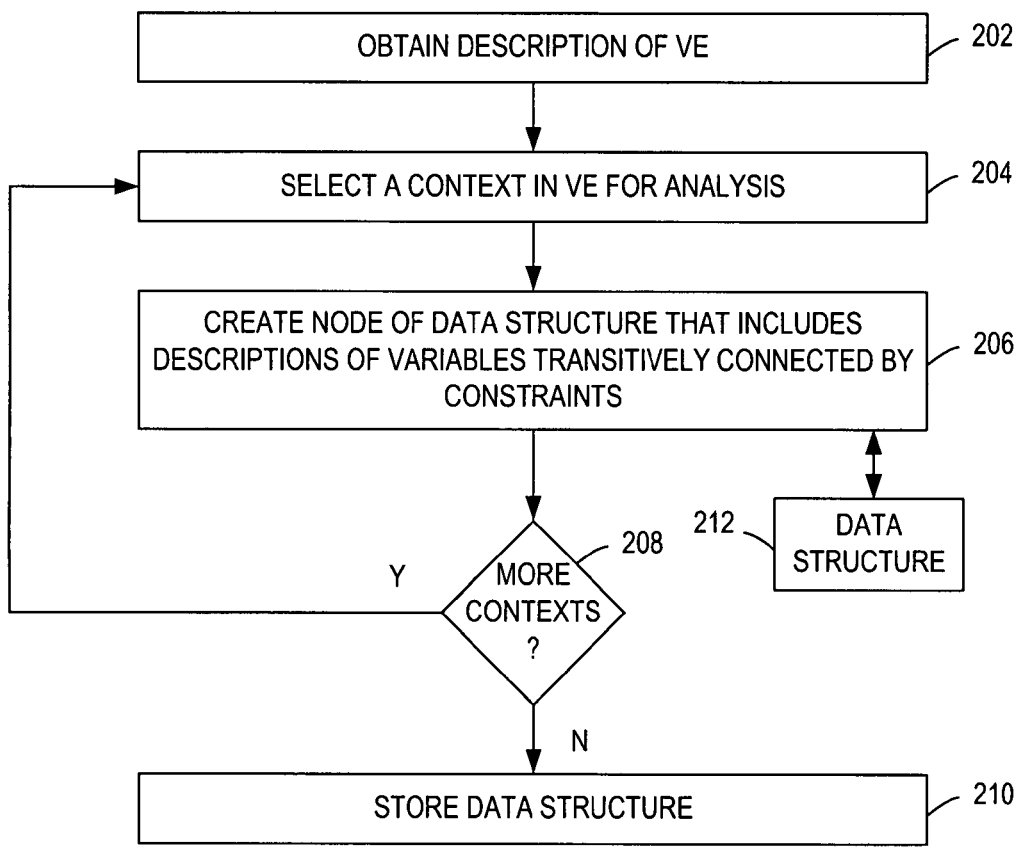
FIG. 2 is a flow diagram depicting an exemplary embodiment of a method for static analysis of a constrained random verification problem in accordance with one or more aspects of the invention.

FIG. 2 is a flow diagram depicting an exemplary embodiment of a method 200 for static analysis of a constrained random verification problem in accordance with one or more aspects of the invention. The method 200 is performed by the static analyzer 116 with respect to a constrained random verification problem resulting from specification of the constraints 106 for the DUT design 110. The constrained random verification problem is modeled by a verification environment (VE) that includes a plurality of generation contexts ("contexts"), each stressing a separate constraint satisfaction problem (CSP). The contexts, however, may share data-types, constraints, and variables. The VE is represented using a hardware-oriented verification specific object-oriented programming language, such as the e code language discussed above. The method 200 converts this abstract representation of the VE into a compact data structure that can subsequently be solved by the run-time system 114.

The method 200 begins at block 202, where a description of the VE is obtained. The VE description includes objects used in a plurality of contexts. An object includes member variables, one or more of which are subject to at least one constraint. In a given context, an object may be defined. For example, in e-code, a context may define a struct, which provides a new data type for use in following contexts. In subsequent contexts, the defined object may be instantiated as a member of another object. For example, in e-code, a context may include a variable of a data type defined by a struct. An object instance inherits its constraints as set forth in the object definition. In a given context, an object instance may be subject to further constraints specific to the context. These further constraints only apply to this particular instance of the object. An exemplary VE description in the e-code language is described below.

The method 200 produces a hierarchical data structure ("data structure 212") that represents the VE. The data structure 212 includes nodes, where each node describes a constraint satisfaction problem set forth by an object defined in the VE. Each node essentially provides a "virtual context" for each object defined in the VE. The description of an object's virtual context is reused when describing instances of the object in subsequent contexts. In particular, at block 204, a context in the VE description is selected for analysis. At block 206, a node of the data structure 212 is created that includes descriptions of variables transitively connected to each other via constraints as set forth in the context. The descriptions are referred to as connected components (CCs). Thus, a node of the data structure 212 includes a set of CCs (a "CCS").

For variables that are instantiated objects in the current context under analysis, CCs from nodes representing the virtual context of the objects are reused in the creation of the present node at block 206. By "reuse" it is meant that CCs from one or more other nodes created during analysis of other context(s) are used to define CCs for the present node. As a result, new CCs are created for newly defined variables (i.e., variables that are not instantiated objects defined in previous contexts). If new constraints are imposed on an instantiated object in the current context under analysis, new CCs are created by modifying existing CCs. For member variables of instantiated objects that do not include constraints specific to the current context under analysis, the associated CCs are fully reused. In some cases, the instantiated objects in the current context under analysis may be identical to another previously analyzed context and thus the previously analyzed context may be reused in its entirety. That is, if all CCs in the current context are reused from a previous context, than the entire previous context is being reused.

At block 208, a determination is made whether there are more contexts to analyze. If so, the method 200 returns to block 204, where another context is selected for analysis. Otherwise, the method 200 proceeds to block 210. At block 210, the hierarchical data structure 212 is stored. The stored data structure 212 is then used by the test generation process described above to generate a correct, random solution to the given set of dynamic constraints.

The data structure 212 produced by the method 200 may be used across multiple simulations of the VE. For example, in constrained random verification, it is typical to simulate a particular instantiation of a VE multiple times with different random seeds. The data structure 212 may be used during each simulation of the VE. As a result, a significant amount of time is saved, since the VE is only analyzed once and the results used for subsequent simulations, rather than analyzing the VE during each simulation.

The method 200 may be further understood with reference to the following example. Consider the following e-code:

```
In file ve.e:
<'
struct S {
    x: int;
    y: int;
    z: int;
    keep x < y;
    keep z == 10;
};
extend sys {
    u: int;
    s1: S;
    s2: S;
    keep s1.y < u;
};
'>
```

In the above example, objects S and sys are defined in two separate contexts. (For present purposes, assume the extension of the object sys is a definition). The object S includes x, y, and z member variables. The keyword "int" denotes an integer. The member variables x and y are constrained such that x is less than y. The keyword "keep" denotes a constraint. Likewise, the member variable z is constrained to be equal to 10. The object sys includes member variables u, s1, and s2. The member variables s1 and s2 are instances of the object S. The member variable y of the instance s1 (denoted as s1.y) is constrained to be less than u.

Figure 3:
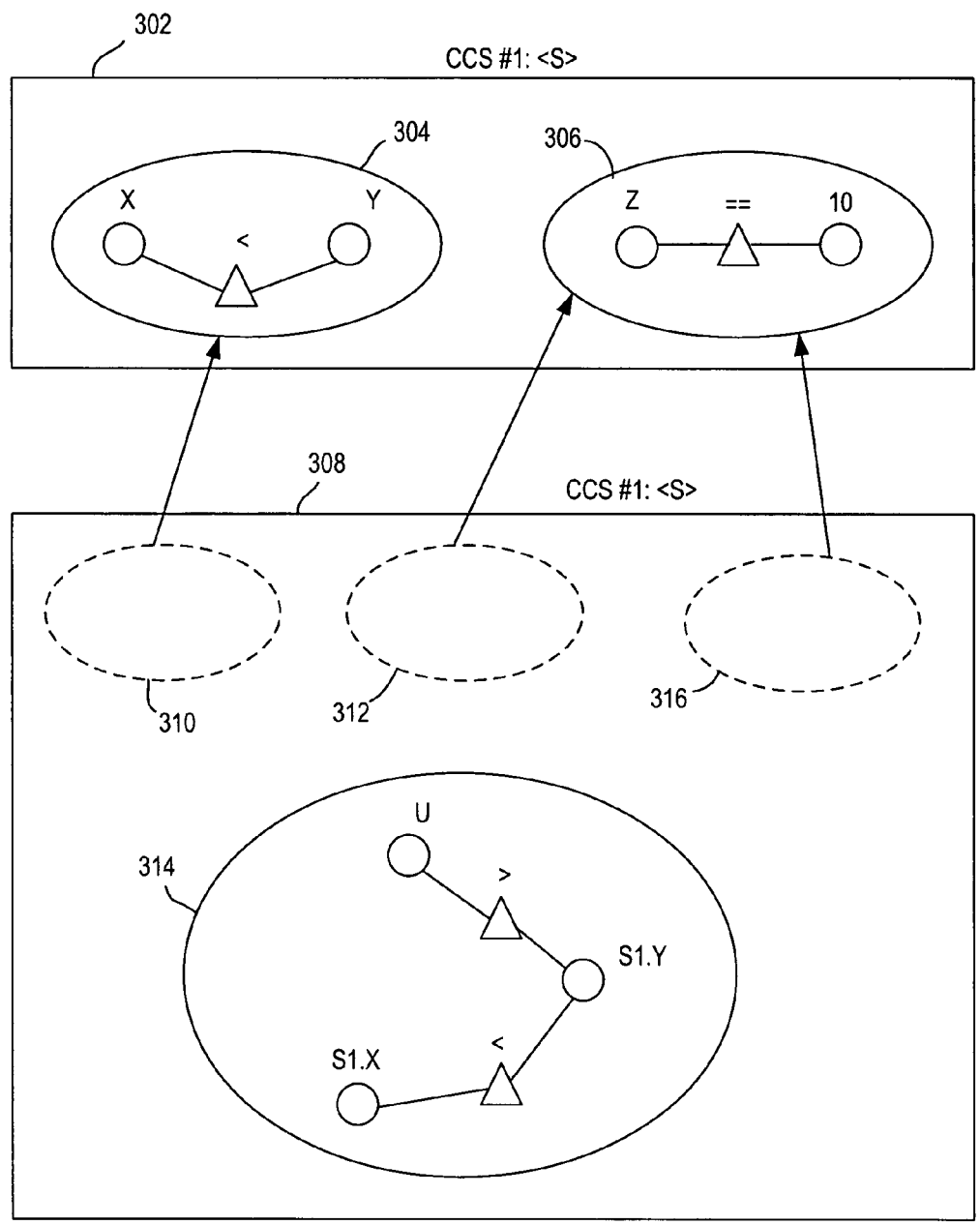
FIG. 3 is a block diagram graphically depicting an exemplary data structure that is produced by the method of FIG. 2.

FIG. 3 is a block diagram graphically depicting a data structure 300 that is produced by the method 200 given the above example. First, the context that defines the object S is selected for analysis. A node 302 in the data structure 300 is created, which is labeled as CCS#1: <S>. The node 302 defines the virtual context for the object S. The node 302 includes a CC 304 and a CC 306. The CC 304 describes the constrained relation between variables x and y, that is, x is less than y. The CC 306 describes the constrained relation for the variable z, that is, z is equal to 10. The context that defines the object S does not include any instances of objects defined in previous contexts. Thus, no previously defined CCs are reused and only new CCs are created (i.e., CCs 304 and 306).

The method 200 then proceeds to the next context, which defines the object sys. A node 308 in the data structure 300 is created, which is labeled as CCS#2:<sys>. The node 308 defines the virtual context for the object sys. The node 308 includes CCs 310, 312, 314, and 316. There are no constraints specific to this context for the s2 instance of the object S. Hence, the CC 310 references the CC 304, which shows that s2.x is less than s2.y. The CC 312 references the CC 306, which shows that s2.z is equal to 10. In this manner, the CCs 304 and 306 of the virtual context for the object S are fully reused to describe the s2 instance of S in the node 308.

Likewise, there are no constrains specific to this context for the z member of the s1 instance of the object S. Hence, the CC 316 references the CC 306, which shows that s1.z is equal to 10. The CC 306 of the virtual context for the object S is fully reused to describe the member z of the s1 instance of S in the node 308. The y member of the s1 instance of the object S does include a constraint specific to this context in that it must be less than the variable u. The CC 314 is created by modifying the CC 304 to account for the new constraint. That is, the CC 314 describes that s1.x is less than s1.y (obtained from the CC 304) and that s1.y is greater than u (new constraint).

In this manner, a hierarchical data structure is produced that describes the VE in the above example. The analysis of the VE is incremental in that CCs created for an object in one context are reused when the object is instantiated in another context. Thus results in a compact data structure and allows for more efficient analysis during test generation.

In aspect oriented languages, such as e-code, data structures (objects) can be extended after they are defined. Therefore, any module of the VE that is loaded to the system can either add new data structures (objects) with their variables and constraints, or extend an existing data structure (object) with variables and/or constraints. A test-file in a constrained-random VE written in e-code is typically an "extension" to the VE that can add any of the above to the VE. The hierarchical data structure produced by the method 200 is configured to be efficiently updated in response to any such extension.

Figure 4:
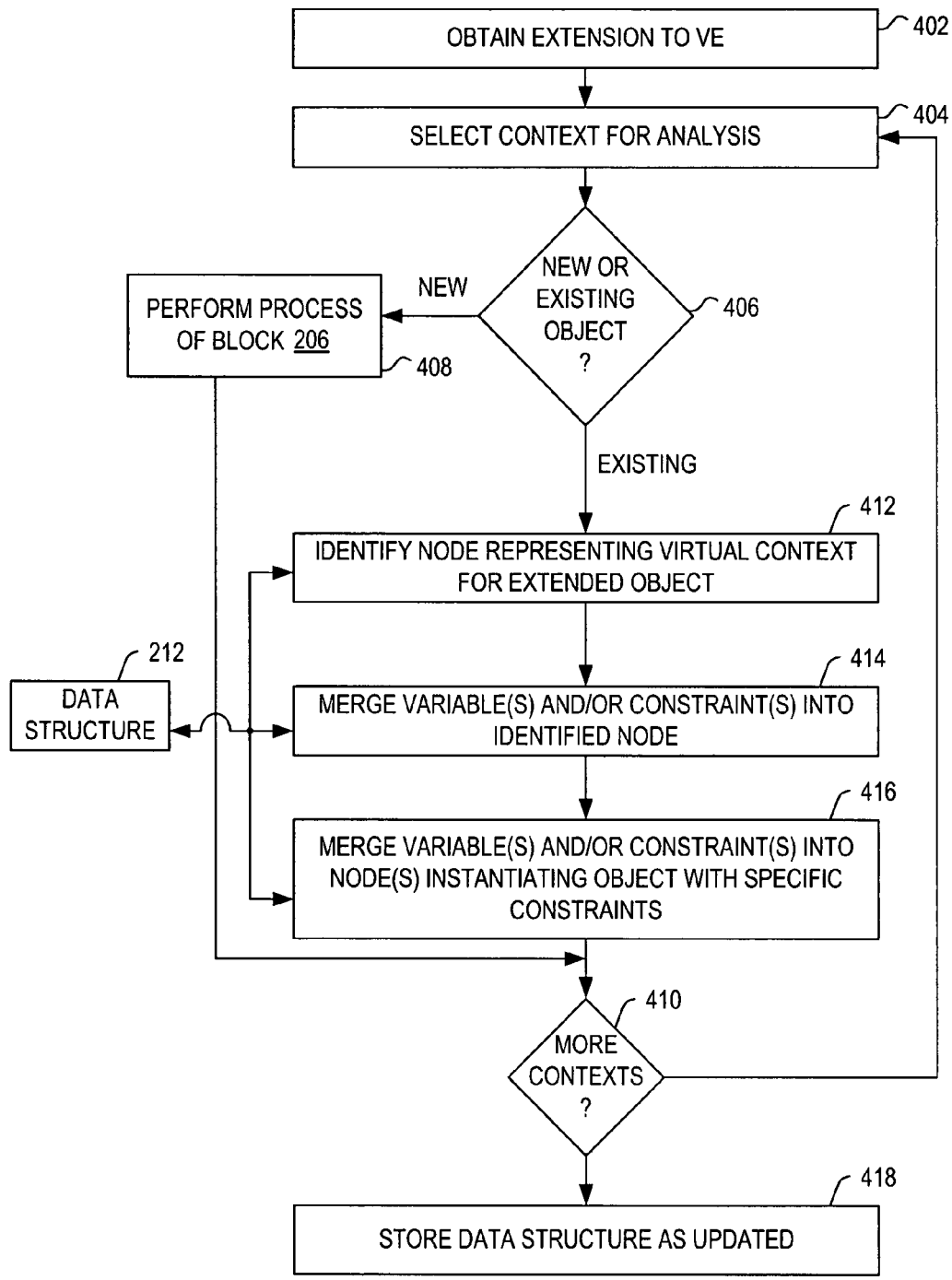
FIG. 4 is a flow diagram depicting an exemplary embodiment of a method for updating a hierarchical data structure produced by the method of FIG. 2 in response to an extension of the verification problem in accordance with one or more aspects of the invention.

In particular, FIG. 4 is a flow diagram depicting an exemplary embodiment of a method 400 for updating a hierarchical data structure produced by the method 200 of FIG. 2 in response to an extension of the VE in accordance with one or more aspects of the invention. At block 402, the extension to the VE is obtained. The extension defines one or more contexts that are added to the VE. Each new context may either define a new object or extend an existing object. At block 404, a context is selected for analysis. At block 406, a determination is made whether the context defines a new object or extends an existing object. If a new object is defined, the method 400 proceeds to block 408. At block 408, the process defined by block 206 is performed. That is, a new node (virtual context) is added to the data structure, as described above. Again, only the new parts of the context are analyzed and all other parts are reused. At block 410, a determination is made whether there are more contexts to analyze. If so, the method 400 returns to block 404, where the next context is selected.

If at block 406 the selected context extends an existing object, the method 400 proceeds to block 412. At block 412, the node representing the virtual context for the object being extended is identified in the data structure 212. At block 414, the variable(s) and/or constraint(s) that extend the object are merged into the identified node. This process refines the set of CCs in the identified node by either: adding one or more new CCs, modifying one or more existing CCs, or merging two or more existing CCs. As a result, all contexts that generate an instance of this object without further constraints will consider the new variable(s) and constraint(s) defined in the extension seamlessly. At block 416, all contexts that generate an instance of the extended object with further specific constraints are identified and the variable(s) and/or constraint(s) that extend the object are merged into the nodes for such contexts. This process is finite, as it is done at most once per context.

The method 400 proceeds from block 416 to block 410. If at block 410 there are no more contexts, the method 400 proceeds to block 418, where the hierarchical compositional data structure 212 as updated is stored. The stored data structure 212 is then used by the test generation process described above.

The method 400 may be further understood with reference to the following example, which extends the VE described in the example of FIG. 3. Consider the following e-code:

```
In file test.e:
<'
extend S {
    keep x > 5;
};
extend sys {
    keep u == 100;
```

```
};
'>
```

In the present example, the module test.e extends the module ve.e described above. The module test.e includes two contexts, one that extends the object S and another that extends the object sys. In the first context, the object S is extended by a new constraint in that the member variable x is constrained to be greater than 5. As set forth in the definition of object S, the member variable x is also constrained to be less than y. In the second context, the object sys is extended by a new constraint in that the member variable u is constrained to be equal to 100. As set forth in the definition of the object sys, the member variable u is also constrained to be greater than s1.y.

Figure 5:
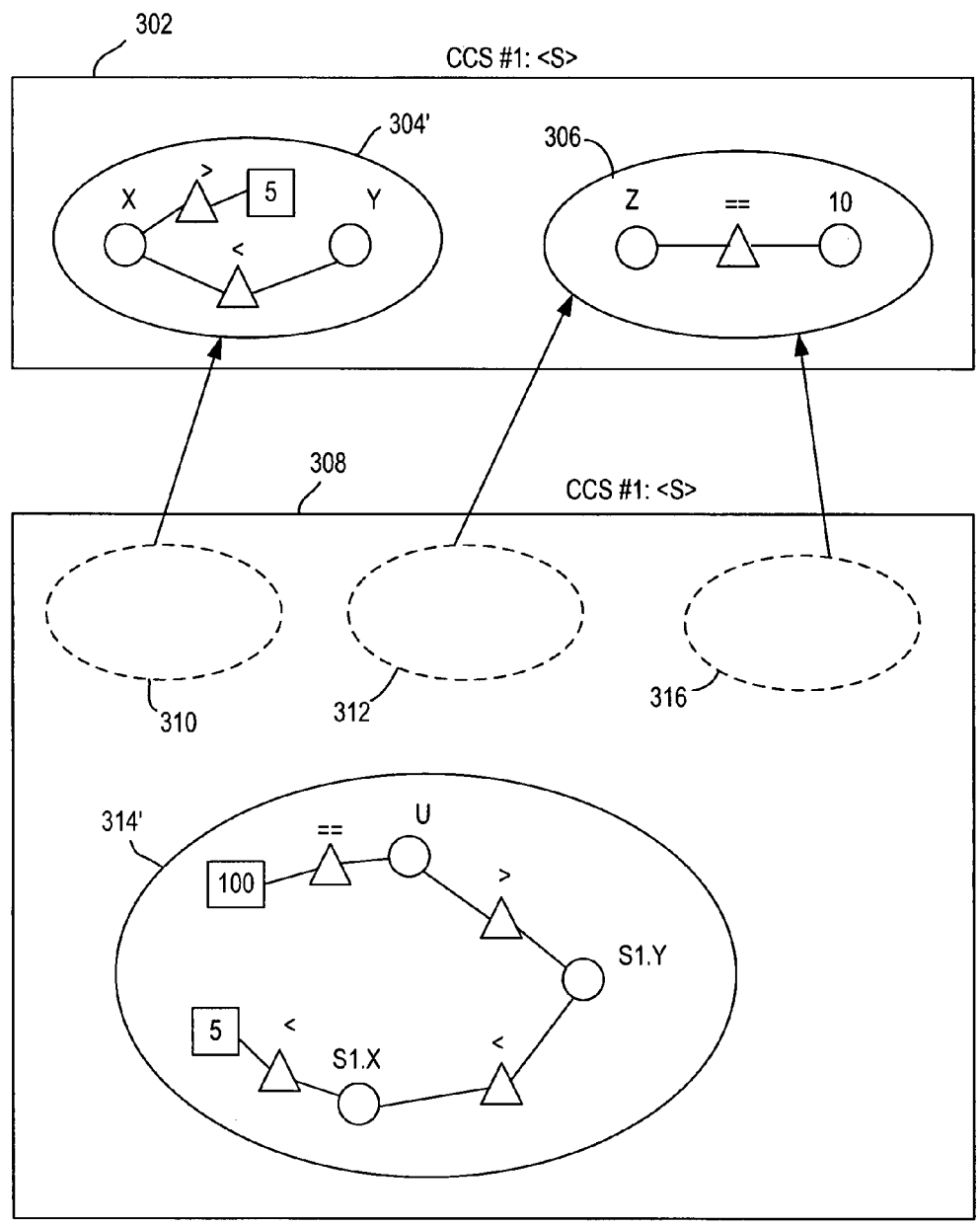
FIG. 5 is a block diagram graphically depicting an exemplary data structure that is produced by the method of FIG. 4.

FIG. 5 is a block diagram graphically depicting a data structure 500 that is produced by the method 400 given the above example. The data structure 500 is an updated version of the data structure 300 given the extensions in the module test.e. Since no new objects are defined by the extension, the data structure 500 still includes the nodes 302 and 308. First, the context that extends the object S is selected for analysis. This context extends object S by constraining x to be greater than 5. The new constraint is merged into the node 302 by updating the CC 304 to create a CC 304'. That is, the CC 304 updated to show that x, which is less than y, is also greater than 5, which results in the CC 304'. The node 308 must also be updated, since the node 308 describes a context that instantiated the object S. As described above, the s2 instance of the object S in node 308 did not include any constraints specific to the context. As such, no modifications of the CCs 310 and 312 are necessary. The addition of the constraint in the extension (x>5) is considered seamlessly, due to the fact that CC 310 references the CC 304'. Since the CC 314 does apply a constraint on the object S specific to the context of the node 308, the CC 314 must be updated to account for the extended constraint (x>5), which creates a CC 314'. Thus, the CC 314 is updated to show that s1.x, which is less than s1.y, is also greater than 5, resulting in the CC 314'.

Next, the context that extends the object sys is selected for analysis. This context extends object sys by constraining u to be equal to 100. The new constraint is merged into the node 308 by updating the CC 314'. That is, the CC 314' is updated to show that u, which is greater than s1.y, is also equal to 100.

In this manner, the hierarchical data structure produced by the method 200 is updated by the method 400 to reflect the extensions to the VE. This framework can be activated when loading a new test on top of a VE that has already been analyzed. Thus, the static analysis done for the whole VE is reused and only the generative information from the new test is processed. This framework can also be activated during test generation run-time, for adding dynamic information that can only be associated with a context at run-time. Such cases may exist even if the whole VE is statically analyzed, as some verification languages (such as e-code) allow a user to apply hierarchical constraints across contexts. Attempting to solve this using traditional methods (i.e., doing it all statically before execution) is so inefficient (due to its inherent complexity) that it becomes impractical for medium and large VEs. Also, as is apparent in the above example, the incremental effort is proportional to the new additions (i.e., to the incremental change to the VE) and not to the original size of the problem. Note that by the end of the incremental analysis of the VE, the status of the system is as if the whole problem was analyzed statically upfront. Hence, the incremental analysis does not deteriorate the overall performance gain.

Figure 6:
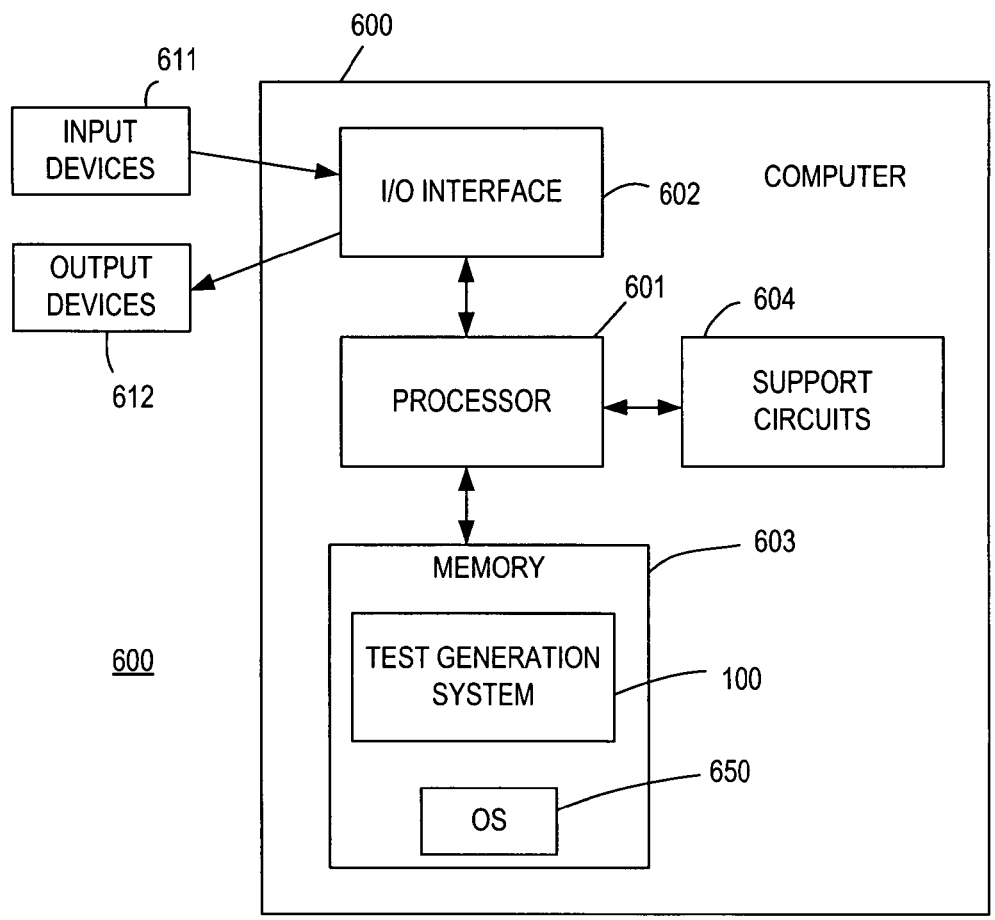
FIG. 6 is a block diagram depicting an exemplary embodiment of a computer suitable for implementing the processes described herein in accordance with one or more aspects of the invention.

FIG. 6 is a block diagram depicting an exemplary embodiment a computer 600 suitable for implementing the processes described herein in accordance with one or more aspects of the invention. The computer 600 includes a processor 601, a memory 603, various support circuits 604, and an I/O interface 602. The processor 601 may include one or more microprocessors known in the art. The support circuits 604 for the processor 601 include conventional cache, power supplies, clock circuits, data registers, I/O interfaces, and the like. The I/O interface 602 may be directly coupled to the memory 603 or coupled through the processor 601. The I/O interface 602 is coupled to various input devices 611 (e.g., keyboard, mouse, and the like) and output devices 612 (e.g., display, printer, and the like).

The memory 603 stores processor-executable instructions and/or data that may be executed by and/or used by the processor 601. These processor-executable instructions may comprise hardware, firmware, software, and the like, or some combination thereof. Modules having processor-executable instructions that are stored in the memory 603 include the test generation system 100. The computer 200 may be programmed with an operating system 650, which may be OS/2, Java Virtual Machine, Linux, Solaris, Unix, Windows, Windows95, Windows98, Windows NT, and Windows2000, WindowsME, and WindowsXP, among other known platforms. At least a portion of an operating system may be disposed in the memory 603. The memory 603 may include one or more of the following random access memory, read only memory, magneto-resistive read/write memory, optical read/write memory, cache memory, magnetic read/write memory, and the like, as well as signal-bearing media as described below.

Method and apparatus for performing static analysis optimization in a design verification system has been described. A hierarchical data structure is generated by static analysis of a constraint system described in a verification environment. The constraint system includes constrained objects used in a plurality of generation contexts. The static analysis processes the constraint system incrementally to efficiently produce a compact data structure. Since the process is incremental, the data structure may be extended to introduce new constraints to the constraint system without re-processing the entire constraint system. Since the entire constraint system does not have to be processed, constraints may be added during runtime. The cost of the static analysis is proportional only to the added constraints and not to the whole constraint satisfaction problem. As such, the static analysis described above speeds up test generation considerably.

An aspect of the invention is implemented as a program product for use with a computer system. Program(s) of the program product defines functions of embodiments and can be contained on a variety of signal-bearing media, which include, but are not limited to: (i) information permanently stored on non-writable storage media (e.g., read-only memory devices within a computer such as CD-ROM or DVD-ROM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct functions of the invention, represent embodiments of the invention.

While the foregoing is directed to embodiments of the present invention, other and further embodiments of the invention may be devised without departing from the basic scope thereof, and the scope thereof is determined by the claims that follow.

What is claimed is:

1. A computer-implemented method of optimizing constraint resolution in a logic design verification system, comprising:
   obtaining a description of a verification environment having constrained objects used in a plurality of contexts, each constrained object including one or more variables subject to at least one constraint;
   converting, using a computer, the description of the verification environment into a hierarchical data structure by analyzing each of the plurality of contexts for the constrained objects incrementally to create nodes in the data structure, each node including a description of variables transitively connected by constraints and at least one node reusing a description from at least one other node;
   changing at least one of the constrained objects of the verification environment;
   analyzing the changed constrained object and reusing at least one unchanged constrained object;
   updating the data structure to incorporate changes made to the verification environment; and
   utilizing the data structure during logic design verification.

2. The method of claim 1, further comprising:
   obtaining an extension to the verification environment that extends at least one of the constrained objects; and
   updating at least one node in the data structure in response to the extension.

3. The method of claim 2, wherein updating comprises:
   merging at least one of a variable or a constraint into at least one description of the at least one node.

4. The method of claim 1, further comprising:
   obtaining an extension to the verification environment that extends one of the constrained objects with a constraint;
   identifying a node of the data structure that corresponds to the one of the constrained objects;
   merging the constraint into the node as identified; and
merging the constraint into at least one node of the data structure that describes an instance of the one of the constrained objects.

5. The method of claim 1, further comprising:
   processing the data structure in the logic design verification system during runtime to generate at least one random solution to a constraint satisfaction problem provided by the verification environment.

6. The method of claim 5, further comprising:
   obtaining an extension to the verification environment that extends at least one of the constrained objects during run-time; and
   updating at least one node in the data structure in response to the extension during run-time.

7. Apparatus for optimizing constraint resolution in a logic design verification system, comprising:
   means for obtaining a description of a verification environment having constrained objects used in a plurality of contexts, each constrained object including one or more variables subject to at least one constraint;
   means for converting the description of the verification environment into a hierarchical data structure by analyzing each of the plurality of contexts for the constrained objects incrementally to create nodes in the data structure, each node including a description of variables transitively connected by constraints and at least one node reusing a description from at least one other node;

means for changing at least one of the constrained objects of the verification environment;
means for analyzing the changed constrained object and reusing at least one unchanged constrained object;
means for updating the data structure to incorporate changes made to the verification environment; and
means for utilizing the data structure during logic design verification.

8. The apparatus of claim 7, further comprising:
means for obtaining an extension to the verification environment that extends at least one of the constrained objects; and
means for updating at least one node in the data structure in response to the extension.

9. The apparatus of claim 8, wherein the means for updating comprises: means for merging at least one of a variable or a constraint into at least one description of the at least one node.

10. The apparatus of claim 7, further comprising: means for obtaining an extension to the verification environment that extends one of the constrained objects with a constraint;
means for identifying a node of the data structure that corresponds to the one of the constrained objects;
means for merging the constraint into the node as identified; and
means for merging the constraint into at least one node of the data structure that describes an instance of the one of the constrained objects.

11. The apparatus of claim 7, further comprising:
means for processing the data structure in the logic design verification system during run-time to generate at least one random solution to a constraint satisfaction problem provided by the verification environment.

12. The apparatus of claim 11, further comprising:
means for obtaining an extension to the verification environment that extends at least one of the constrained objects during run-time; and
means for updating at least one node in the data structure in response to the extension during run-time.

13. A test generation system, comprising:
a simulator configured to simulate a design for a device under test;
a static analyzer configured to obtain a description of a verification environment having constrained objects used in a plurality of contexts, each constrained object including one or more variables subject to at least one constraint, and convert the description of the verification environment into a hierarchical data structure by incrementally analyzing each of the plurality of contexts for the constrained objects, analyze at least one changed constrained object, reuse at least one unchanged constrained object, and update the data structure to incorporate changes made to the verification environment;
a test generator configured to process the data structure to generate at least one random solution to a constraint satisfaction problem provided by the verification environment; and
a run-time system configured to drive and sample the simulator based on the at least one random solution.

14. The system of claim 13, wherein the static analyzer is configured to:
create, for each of the constrained objects, a node that includes descriptions of variables transitively connected by constraints; and
reuse, for at least one node in the data structure, at least one description from at least one other node in the data structure.

15. The system of claim 13, wherein the static analyzer is further configured to:
obtain an extension to the verification environment that extends one of the constrained objects with a constraint;
identify a node of the data structure that corresponds to the one of the constrained objects;
merge the constraint into the node as identified; and
merge the constraint into at least one node of the data structure that describes an instance of the one of the constrained objects.

16. The system of claim 13, wherein the static analyzer is configured to: obtain an extension to the verification environment that extends at least one of the constrained objects; and update the data structure in response to the extension.

17. The system of claim 13, wherein the static analyzer is configured to: obtain an extension to the verification environment that extends at least one of the constrained objects during run-time; and
update the data structure in response to the extension during run-time.

* * * * *